United States Patent [19]
Weber

[11] Patent Number: 6,104,226
[45] Date of Patent: Aug. 15, 2000

[54] CIRCUIT CONFIGURATION FOR DIGITALLY SETTING ANALOG PARAMETERS

[75] Inventor: Stephan Weber, München, Germany

[73] Assignee: Siemens Aktiengesellschaft, Munich, Germany

[21] Appl. No.: 09/221,568

[22] Filed: Dec. 28, 1998

Related U.S. Application Data

[63] Continuation of application No. PCT/DE97/01325, Jun. 25, 1997.

[30] Foreign Application Priority Data

Jun. 26, 1996 [DE] Germany ............................ 196 25 624

[51] Int. Cl.⁷ ..................................................... G06G 7/16
[52] U.S. Cl. ........................................... 327/359; 327/355
[58] Field of Search ...................................... 327/355, 356, 327/357, 359, 361, 65, 66, 77, 89, 560–563, 350, 352; 330/254; 455/326

[56] References Cited

U.S. PATENT DOCUMENTS

| 5,297,157 | 3/1994 | Kaiser et al. | 372/38 |
|---|---|---|---|
| 5,619,169 | 4/1997 | Matsuura | 330/254 |
| 5,630,228 | 5/1997 | Mittel | 327/359 |
| 5,903,185 | 5/1999 | Cargill | 327/361 |

*Primary Examiner*—Toan Tran
*Attorney, Agent, or Firm*—Herbert L. Lerner; Laurence A. Greenberg; Werner H. Stemer

[57] ABSTRACT

A circuit configuration for digitally setting analog parameters includes at least two analog multiplying devices each having a differential amplifier stage. The differential amplifier stages have differential inputs connected in parallel with one another and driven by an analog bipolar input signal. The differential amplifier stages have outputs coupled to one another cumulatively. The differential amplifier stages receive supply currents which are to be switched on and off individually as a function of a corresponding digital control signal and are graded using binary code.

1 Claim, 1 Drawing Sheet

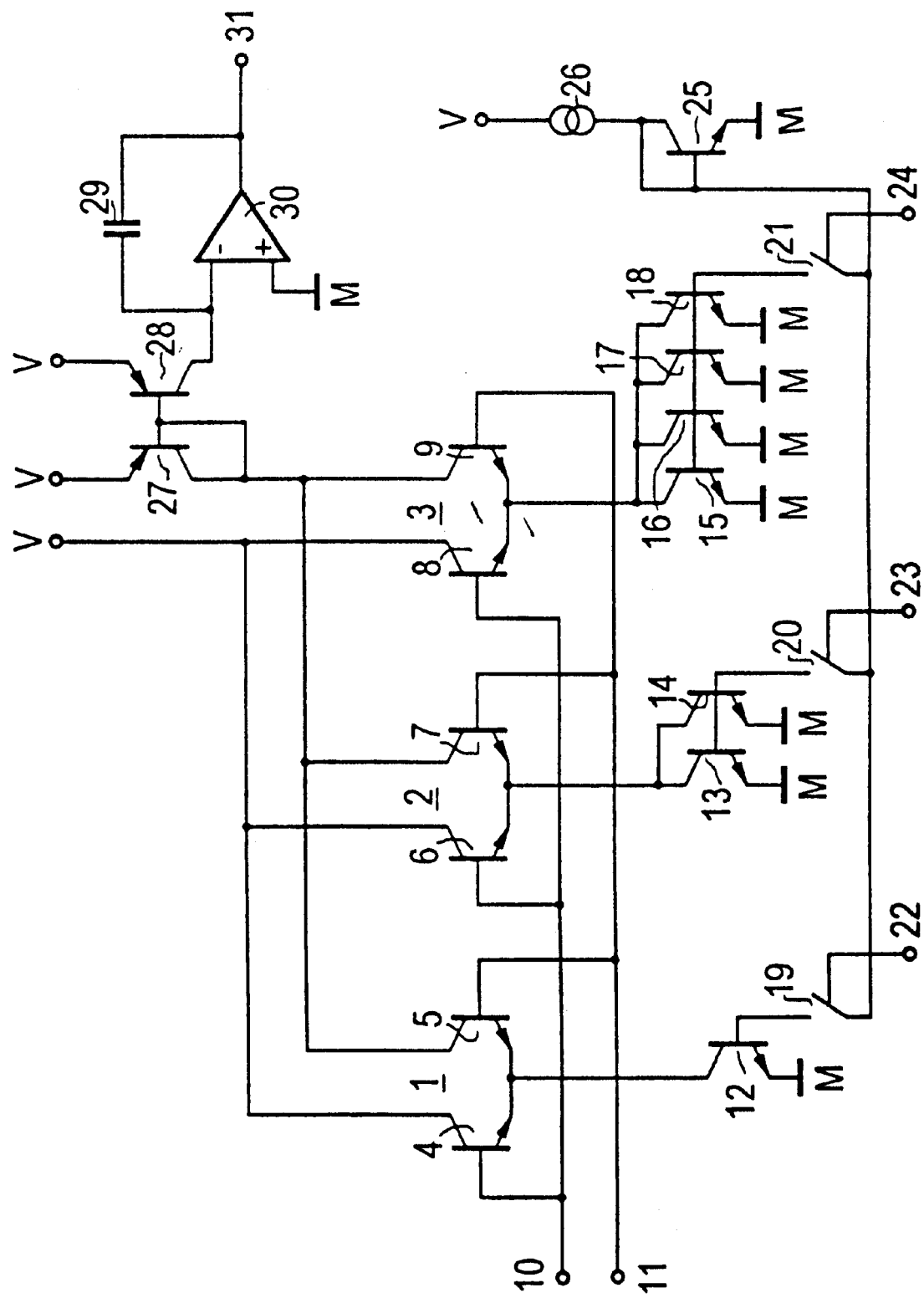

CIRCUIT CONFIGURATION FOR DIGITALLY SETTING ANALOG PARAMETERS

CROSS-REFERENCE TO RELATED APPLICATION

This application is a continuation of copending International Application No. PCT/DE97/01325, filed Jun. 25, 1997, which designated the United States.

BACKGROUND OF THE INVENTION

Field of the Invention

The invention relates to a circuit configuration for digitally setting analog parameters.

Such circuit configurations are used, for example, for digitally setting filter parameters of an analog filter or for digitally setting the gain of an analog amplifier.

A book entitled "Electronic Circuits—Design and Applications", by U. Tietze and Ch. Schenk, Berlin, Heidelberg 1991, pages 399 to 402, discloses the use of a digital/analog converter having a resistor network for digitally setting respective parameters. The digital/analog converter takes the place of a corresponding resistor element producing the respective parameter. U.S. Pat. No. 3,309,508 describes a circuit configuration for multiplying two analog voltages, in which the first of the two voltages is converted into a digital representation before multiplication. Each individual bit of the digital representation switches a current switch having an input to which the second analog voltage is connected. The current flowing out of the current switches is then weighted through the use of resistors. Each resistance value corresponds to the weighting of the respective bit and has to be set exactly for a precise result.

However, resistors integrated in integrated circuits have a wide component tolerance, as well as a considerable temperature response, so that they can only be used to produce very noncritical configurations, or else they require considerable additional complexity in order to achieve sufficient accuracy and constancy. Higher-order digitally adjustable filters with a relatively high degree of accuracy therefore require comparatively high circuit complexity.

SUMMARY OF THE INVENTION

It is accordingly an object of the invention to provide a circuit configuration for digitally setting analog parameters, which overcomes the hereinafore-mentioned disadvantages of the heretofore-known devices of this general type and which requires relatively little circuitry complexity.

With the foregoing and other objects in view there is provided, in accordance with the invention, a circuit configuration for digitally setting analog parameters, comprising at least two analog multiplying devices each having a differential amplifier stage; the differential amplifier stages having differential inputs connected in parallel with one another and driven by an analog bipolar input signal; the differential amplifier stages having outputs coupled to one another cumulatively; and the differential amplifier stages receiving supply currents to be switched on and off individually as a function of a corresponding digital control signal and graded or graduated using binary code.

In this configuration, the multiplying devices can have current outputs connected in parallel with one another.

The multiplying devices also have differential amplifier stages with inputs to which the input signal is applied and supply currents that can be switched on and off, correspond to weighting signals.

The weighting signals are graded using binary code so that it is possible to set the analog parameters on the basis of multibit binary words.

Other features which are considered as characteristic for the invention are set forth in the appended claims.

Although the invention is illustrated and described herein as embodied in a circuit configuration for digitally setting analog parameters, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The FIGURE of the drawing is a schematic diagram of a circuit according to the invention.

DESCRIPTION OF THE PREFERRED EMBODIMENTS

Referring now in detail to the single FIGURE of the drawing, there is seen an exemplary embodiment which has three multiplying devices 1, 2, 3 each having two respective emitter-coupled npn-transistors 4, 5 and 6, 7 and 8, 9.

Inputs of the multiplying devices 1, 2, 3 are connected in parallel with one another, in such a way that bases of the transistors 4, 6, 8 are connected together so as to form a differential input and bases of the transistors 5, 7, 9 are connected together so as to form a differential input. Difference input signals 10, 11 are respectively applied to these inputs.

In this configuration, coupled emitters of the transistors 4, 5, the transistors 6, 7 and the transistors 8, 9 respectively form further inputs of the multiplying devices 1, 2, 3, to which weighting signals are applied. Respective output currents are then present at collectors of the transistors 4, 5, the transistors 6, 7 and the transistors 8, 9. These currents are the same as the product of an input voltage forming the input signal 10, 11 and a current forming the respective weighting signal and being input into the coupled emitters of the transistors 4, 5, the transistors 6, 7 and the transistors 8, 9.

These currents are formed by output paths of a current bank. The individual output paths have different current levels and are each individually connectable to an input path. In order to produce different current levels, a different number of identical transistors are respectively connected in parallel for each output path. Therefore, the output path which can be allocated to the multiplying device 1 is formed by a transistor 12, the output path which can be allocated to the multiplying device 2 is formed by two npn-transistors 13 and 14, and the output path which can be allocated to the multiplying device 3 is formed by four npn-transistors 15 to 18. In this case, emitters of the transistors 12 to 18 are connected to a reference-ground potential M, whereas collectors thereof are connected to the coupled emitters of the transistors 4, 5, the transistors 6, 7 and the transistors 8, 9, according to the respective allocation. Bases of the transistors 12 to 18 are connected to one another in groups according to their allocation and can be connected to the associated input path through a respective controlled switch 19, 20, 21. The switches 19 to 21 are controlled by appropriate control signals 22 to 24. The control signals 22 to 24 are binary coded according to a binary grading of the individual output paths of the current mirror.

The input path of the current mirror is formed by an npn-transistor 25, having an emitter which is connected to the reference-ground potential M and having a base and collector that are connected to one another and to a supply potential V through a common current source 26. A voltage is therefore present across the emitter/collector path of the transistor 25. That voltage can be connected to the base/emitter junctions of the transistors 12 to 18 through the switches 22 to 24.

Cumulative coupling of the outputs of the multiplying devices 1, 2, 3 is achieved, on one hand, by connecting the collectors of the transistors 4, 6, 8 to one another and, on the other hand, by connecting the collectors of the transistors 5, 7, 9 to one another. The collectors of the transistors 4, 6, 8 in this case are connected directly to the supply potential V, while the collectors of the transistors 5, 7, 9 are coupled to the supply potential V with the interposition of an input circuit of a further current mirror. The input circuit of the further current mirror is formed by a pnp-transistor 27, having an emitter connected to the supply potential V and having a base and collector connected both to the collectors of the transistors 5, 7 and 9 and to a base of a pnp-transistor 28. The transistor 28 has an emitter which is likewise connected to the supply potential V and a collector that forms an output of the circuit configuration according to the invention.

In the exemplary embodiment, the circuit configuration according to the invention is used as an analog integrator having an integration time constant which can be set digitally for a given, constant capacitance 29 using the binary signals 22 to 24. To this end, the collector of the transistor 28 is coupled to an inverting input of an operational amplifier 30 having a noninverting input that is connected to the reference-ground potential M. In this configuration, the capacitance 29 is connected between an output and the inverting input of the operational amplifier 30. On one hand, an output signal 31 which can be tapped off at the output of the operational amplifier 30 is produced from the input signal 10, 11 by integration with a time constant that can be set through the use of the control signals 22 to 24. On the other hand, such an integrator can, for its part, be used as a universal filter, for example.

As can be seen, no resistor elements are used for parameter setting in a circuit configuration according to the invention. Transistor elements, which are considerably simpler to manufacture by using integrated circuit technology, are used instead so that higher accuracy and constancy are obtained with considerably less circuitry, overall.

I claim:

1. A circuit configuration for digitally setting analog parameters, comprising:

at least two analog multiplying devices each having a differential amplifier stage;

at least one transistor having an output supplying current to one of said analog multiplying devices;

a plurality of transistors having outputs connected in parallel to supply current to another one of said analog multiplying devices;

said differential amplifier stages having differential inputs connected in parallel with one another and driven by an analog bipolar input signal;

said differential amplifier stages having outputs coupled to one another cumulatively; and said current supplied by said at least one transistor and said current supplied by said plurality of transistors being switched on and off individually as a function of a corresponding digital control signal and graded using binary code.

* * * * *